(12) United States Patent
Kuramochi et al.

(10) Patent No.: US 11,562,864 B2
(45) Date of Patent: Jan. 24, 2023

(54) SAFETY SWITCH INPUT DIAGNOSIS DEVICE AND WORK MACHINE USING SAFETY SWITCH INPUT DIAGNOSIS DEVICE

(71) Applicant: HITACHI CONSTRUCTION MACHINERY CO., LTD., Tokyo (JP)

(72) Inventors: Yuichi Kuramochi, Tsuchiura (JP); Hidefumi Ishimoto, Tsukuba (JP); Akiyoshi Kirimura, Tsukuba (JP)

(73) Assignee: HITACHI CONSTRUCTION MACHINERY CO., LTD., Tokyo (JP)

( * ) Notice: Subject to any disclaimer, the term of this patent is extended or adjusted under 35 U.S.C. 154(b) by 195 days.

(21) Appl. No.: 16/979,339

(22) PCT Filed: Jul. 4, 2019

(86) PCT No.: PCT/JP2019/026729
§ 371 (c)(1),
(2) Date: Sep. 9, 2020

(87) PCT Pub. No.: WO2020/066204
PCT Pub. Date: Apr. 2, 2020

(65) Prior Publication Data
US 2021/0005402 A1   Jan. 7, 2021

(30) Foreign Application Priority Data
Sep. 26, 2018   (JP) .............................. JP2018-181053

(51) Int. Cl.
*H02P 8/04* (2006.01)
*H02H 3/32* (2006.01)
(Continued)

(52) U.S. Cl.
CPC ........ *H01H 3/022* (2013.01); *B60W 50/0098* (2013.01); *H01H 83/16* (2013.01); *H02H 1/0061* (2013.01); *H02H 3/042* (2013.01)

(58) Field of Classification Search
CPC .................................. H02H 7/18; H02P 21/06
See application file for complete search history.

(56) References Cited

U.S. PATENT DOCUMENTS

2016/0258993 A1* 9/2016 Bagchi .................... G01R 31/52
2017/0355267 A1* 12/2017 Zhou ....................... H02M 1/32

FOREIGN PATENT DOCUMENTS

CN    103487704 A    1/2014
JP    2008-159423 A   7/2008
(Continued)

OTHER PUBLICATIONS

International Preliminary Report on Patentability received in corresponding International Application Mo PCT/JP2019/026729 dated Apr. 8, 2021.
(Continued)

*Primary Examiner* — Kawing Chan
*Assistant Examiner* — Charles S Laughlin
(74) *Attorney, Agent, or Firm* — Mattingly & Malur, PC

(57) ABSTRACT

A safety switch input diagnosis device includes a circuit formed from a series connection of an emergency stop switch and a line having a resistor. A connection state of the emergency stop switch and failure modes of the lines are diagnosed on the basis of a voltage value at one end of the circuit. Consequently, an operation of the switch and failure modes of a circuit relating to the switch can be diagnosed.

5 Claims, 10 Drawing Sheets

(51) Int. Cl.
*H01H 3/02* (2006.01)
*B60W 50/00* (2006.01)
*H01H 83/16* (2006.01)
*H02H 1/00* (2006.01)
*H02H 3/04* (2006.01)

(56) References Cited

FOREIGN PATENT DOCUMENTS

| | | | |
|---|---|---|---|
| JP | 2011-247843 | A | 12/2011 |
| JP | 2012-133905 | A | 7/2012 |
| JP | 2013-246985 | A | 12/2013 |
| JP | 2016-124077 | A | 7/2016 |

OTHER PUBLICATIONS

International Search Report of PCT/JP2019/026729 dated Sep. 17, 2019.

Chinese Office Action received in corresponding Chinese Application No. 201980015468.9 dated Aug. 3, 2022.

* cited by examiner

FIG. 3

| SW ACTION/FAILURE MODE | ADIN VOLTAGE VALUE |
|---|---|
| EMERGENCY STOP OPERATION(OPEN) | (Vcc-GND)*{R4(R3+R5)/(R3+R5+R4)}/{(R3+R5)R4/(R3+R5+R4)+R1} |
| EMERGENCY STOP OPERATION(CLOSE) | (Vcc-GND)*{(R5+R3R2/(R3+R2))R4/(R5+R3R2/(R3+R2)+R4)/ [((R5+R3R2/(R3+R2))R4/(R5+R3R2/(R3+R2)+R4)+R1] |
| LINE L1 HIGH LEVEL SHORT-CIRCUIT | NO INFLUENCE |
| LINE L1 LOW LEVEL SHORT-CIRCUIT | L STICKING (GND) |
| LINE L1 DISCONNECTION | L STICKING (GND) |
| LINE L2 HIGH LEVEL SHORT-CIRCUIT | H STICKING (Vcc) |
| LINE L2 LOW LEVEL SHORT-CIRCUIT | L STICKING (GND) |
| LINE L2 DISCONNECTION | L STICKING (GND) |
| LINE L3 HIGH LEVEL SHORT-CIRCUIT(OPEN) | (Vcc-GND)*R4/{R4+R1 R3R2/(R3R2+R1 R2+R1 R3)] |
| LINE L3 HIGH LEVEL SHORT-CIRCUIT(CLOSE) | H STICKING(Vcc) |
| LINE L3 LOW LEVEL SHORT-CIRCUIT(OPEN) | (Vcc-GND)*{R3R4/(R3+R4)}/{R3R4/(R3+R4)+R1} |
| LINE L3 DISCONNECTION | (Vcc-GND)*R4/(R1+R4) |
| LINE L1 AND LINE L2 SHORT-CIRCUIT | H STICKING(Vcc) |
| LINE L1 TO LINE L3 SHORT-CIRCUIT | SAME AS LINE L3 HIGH LEVEL SHORT-CIRCUIT |
| LINE L2 AND LINE L3 SHORT-CIRCUIT | (Vcc-GND)*{R4R5/(R4+R5)}/{R1+R4R5/(R4+R5)} |

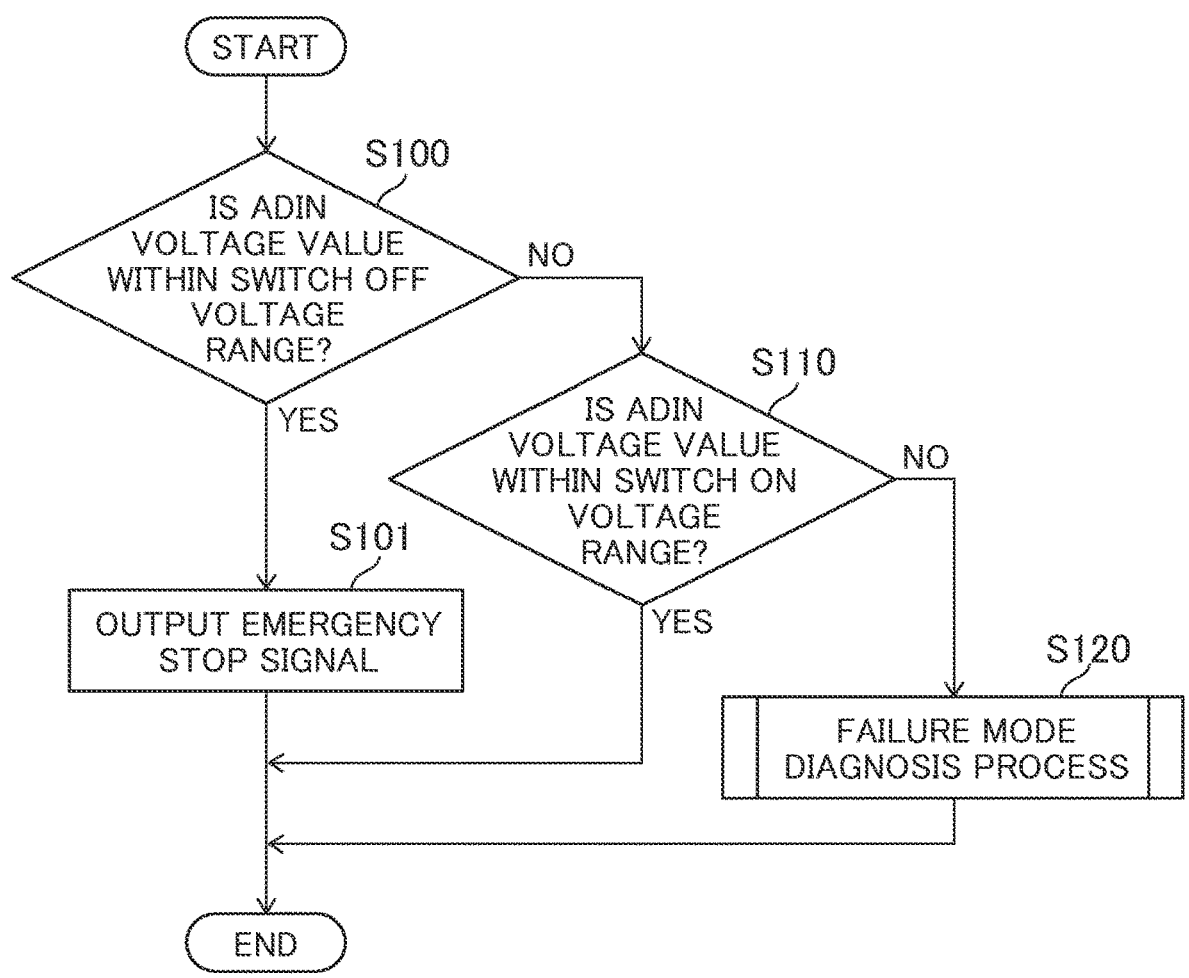

FIG. 7

| SW ACTION/FAILURE MODE | ADIN(1) VOLTAGE VALUE |
|---|---|
| EMERGENCY STOP OPERATION(OPEN) | (LINE L2 VOLTAGE VALUE)=(Vcc-GND)*(R3+R7+R5)*(R6+R4)*5V/((R1+R8)*(R3+R7+R5)+(R3+R7+R5)*(R1+R8)*(R6+R4))<br>ADIN(1) VOLTAGE VALUE=(LINE L2 VOLTAGE VALUE)*R4/(R4+R6) |
| EMERGENCY STOP OPERATION(CLOSE) | (LINE L2 VOLTAGE VALUE)=(Vcc-GND)*R3R2/(R3+R2)+R7+R5)*(R6+R4)*5V/((R1+R8)*R3R2/(R3+R2)+R7+R5)*(R3+R2)+R7+R5)*(R6+R4)+(R1+R8)*(R6+R4))<br>ADIN(1) VOLTAGE VALUE=(LINE L2 VOLTAGE VALUE)*R4/(R4+R6) |
| LINE L1 HIGH LEVEL SHORT-CIRCUIT | NO INFLUENCE(Vcc) |
| LINE L1 LOW LEVEL SHORT-CIRCUIT | L STICKING(GND) |
| LINE L1 DISCONNECTION | L STICKING(GND) |
| LINE L2 HIGH LEVEL SHORT-CIRCUIT(OPEN) | (Vcc-GND)*R4/(R4+R6) |
| LINE L2 HIGH LEVEL SHORT-CIRCUIT(CLOSE) | SAME AS LINE L2 HIGH LEVEL SHORT-CIRCUIT(OPEN) |
| LINE L2 LOW LEVEL SHORT-CIRCUIT | L STICKING(GND) |
| LINE L2 DISCONNECTION(OPEN) | L STICKING(GND) |
| LINE L2 DISCONNECTION(CLOSE) | L STICKING(GND) |
| LINE L3 HIGH LEVEL SHORT-CIRCUIT(OPEN) | SAME AS LINE L2 HIGH LEVEL SHORT-CIRCUIT(OPEN) |
| LINE L3 HIGH LEVEL SHORT-CIRCUIT(CLOSE) | SAME AS LINE L2 HIGH LEVEL SHORT-CIRCUIT(OPEN) |
| LINE L3 LOW LEVEL SHORT-CIRCUIT(OPEN) | (LINE L2 VOLTAGE VALUE)=R3*(R6+R4)*5V/((R1+R8)*R3*R3*(R6+R4)+(R1+R8)*(R6+R4))<br>ADIN(1) VOLTAGE VALUE=(LINE L2 VOLTAGE VALUE)*R4/(R4+R6) |
| LINE L3 LOW LEVEL SHORT-CIRCUIT(CLOSE) | (LINE L2 VOLTAGE VALUE)=(Vcc-GND)*(R3R2/(R3+R2))*(R6+R4)*5V/((R1+R8)*(R3R2/(R3+R2))+R3R2/(R3+R2))*(R6+R4)+(R1+R8)*(R6+R4))<br>ADIN(1) VOLTAGE VALUE=(LINE L2 VOLTAGE VALUE)*R4/(R4+R6) |
| LINE L3 DISCONNECTION | (Vcc-GND)*(R8+R1+R4+R6) |
| LINE L1 AND LINE L2 SHORT-CIRCUIT | (Vcc-GND)=R4/(R8+R4+R6) |
| LINE L1 TO LINE L3 SHORT-CIRCUIT | SAME AS LINE L3 DISCONNECTION |
| LINE L2 AND LINE L3 SHORT-CIRCUIT | (LINE L2 VOLTAGE VALUE)=(Vcc-GND)*(R7+R5)*(R6+R4)*5V/((R1+R8)*(R7+R5)*(R6+R4)+(R1+R8)*(R6+R4))<br>ADIN(1) VOLTAGE VALUE=(LINE L2 VOLTAGE VALUE)*R4/(R4+R6) |

FIG. 8

| SW ACTION/FAILURE MODE | ADIN(2) VOLTAGE VALUE |
|---|---|
| EMERGENCY STOP OPERATION(OPEN) | (LINE L3 VOLTAGE VALUE)=(Vcc-GND)*(R3+R7+R5)*(R6+R4)*5V/((R1+R8)*(R3+R7+R5)*(R6+R4)+(R3+R7+R5)*(R6+R4)+(R1+R8)*(R6+R4))<br>ADIN(2) VOLTAGE VALUE=LINE L3 VOLTAGE VALUE*R5/(R5+R3+R7) |
| EMERGENCY STOP OPERATION(CLOSE) | (LINE L3 VOLTAGE VALUE)=(Vcc-GND)*R3R2/(R3+R2)+R7+R5)*(R6+R4)*5V/((R1+R8)*R3R2/(R3+R2)+R7+R5)+R3R2/(R3+R2)+R7+R5)*(R6+R4)+(R1+R8)*(R6+R4))<br>ADIN(2) VOLTAGE VALUE=LINE L3 VOLTAGE VALUE*R5/R5+R3R2/(R3+R2)+R7) |
| LINE L1 HIGH LEVEL SHORT-CIRCUIT | NO INFLUENCE (Vcc) |
| LINE L1 LOW LEVEL SHORT-CIRCUIT | L STICKING (GND) |
| LINE L1 DISCONNECTION | L STICKING (GND) |
| LINE L2 HIGH LEVEL SHORT-CIRCUIT(OPEN) | (Vcc-GND)*R5/(R7+R5+R3) |
| LINE L2 HIGH LEVEL SHORT-CIRCUIT(CLOSE) | (Vcc-GND)*R5/(R7+R5+R3R2/(R3+R2)) |
| LINE L2 LOW LEVEL SHORT-CIRCUIT | L STICKING (GND) |
| LINE L2 DISCONNECTION(OPEN) | (Vcc-GND)*R5/(R8+R1+R3+R7+R5) |
| LINE L2 DISCONNECTION(CLOSE) | (Vcc-GND)*R5/(R8+R1+R3R2/(R3+R2)+R7+R5) |
| LINE L3 HIGH LEVEL SHORT-CIRCUIT(OPEN) | (Vcc-GND)*R5/(R7+R5) |
| LINE L3 HIGH LEVEL SHORT-CIRCUIT(CLOSE) | SAME AS LINE L3 HIGH LEVEL SHORT-CIRCUIT(OPEN) |
| LINE L3 LOW LEVEL SHORT-CIRCUIT(OPEN) | L STICKING (GND) |
| LINE L3 LOW LEVEL SHORT-CIRCUIT(CLOSE) | L STICKING (GND) |
| LINE L3 DISCONNECTION | L STICKING (GND) |
| LINE L1 AND LINE L2 SHORT-CIRCUIT | (Vcc-GND)*R5/(R8+R3+R7+R5) |
| LINE L1 TO LINE L3 SHORT-CIRCUIT | (Vcc-GND)*R5/(R8+R7+R5) |
| LINE L2 AND LINE L3 SHORT-CIRCUIT | (LINE L3 VOLTAGE VALUE)=(Vcc-GND)*(R7+R5)*(R6+R4)*5V/((R1+R8)*(R7+R5)*(R6+R4)+(R7+R5)*(R6+R4)+(R1+R8)*(R6+R4))<br>ADIN(2) VOLTAGE VALUE=LINE L3 VOLTAGE VALUE*R5/(R5+R7) |

SAFETY SWITCH INPUT DIAGNOSIS DEVICE AND WORK MACHINE USING SAFETY SWITCH INPUT DIAGNOSIS DEVICE

TECHNICAL FIELD

The present invention relates to a safety switch input diagnosis device and a work machine using the safety switch input diagnosis device.

BACKGROUND ART

As a technology relating to functional safety support of an operation switch for emergency stop action, for example, Patent Document 1 discloses a wiring method for a robot for causing a plurality of robot controllers to perform emergency stop action by an operation of a single operation switch. The wiring method is performed by a robot system configured from a single master controller that includes a first safety monitoring section that performs emergency stop action on the basis of whether or not a safety input signal via the operation switch is inputted and a second safety monitoring section that performs emergency stop action on the basis of whether or not a safety input signal via the operation switch is inputted and outputs a permission signal, and equal to or more than slave controllers each including the first safety monitoring section and emergency stopping means that acts in response to the permission signal. In the wiring method, the master controller wires an input path for a safety input signal via the operation switch and an output path for the permission signal outputted from the second safety monitoring section of the master controller in such a manner as to allow outputting to the outside, connects the operation switch and the master controller to each other by a first connection cable, and connects the master controller and the slave controller to each other by a second connection table. The slave controller connects the first safety monitoring section to the input path for the safety input signal and connects the emergency stop means to the output path or the permission signal.

PRIOR ART DOCUMENT

Patent Document

Patent Document 1: JP-2016-124077-A

SUMMARY OF THE INVENTION

Problem to be Solved by the Invention

In the prior art described above, a failure of a circuit including an operation switch is diagnosed by monitoring whether or not a potential state occurring when a test pulse is inputted to the circuit. However, in the prior art described above, an open state by an operation of the operation switch and a disconnection state of a line cannot be distinguished from each other, and the countermeasure related to functional safety is not sufficient.

The present invention has been made in view of the foregoing, and it is an object of the present invention to provide a safety switch input diagnosis device that can diagnose an operation of a switch and a failure mode of a circuit relating to the switch and a work machine that uses the safety switch input diagnosis device.

Means for Solving the Problem

Although the present application includes a plurality of means for solving the subject described above, as an example of the means, a safety switch input diagnosis device is cited which includes a first circuit formed from a series connection of a switch capable of interrupting connection between a first contact and a second contact and a line having a first resistor connected to the first or the second contact of the switch, a second circuit having a second resister between one end and another end and connected at the one end to one end of the first circuit, a third circuit connected at one end to the other end of the second circuit and at another end to a power supply, a fourth circuit connected at one end to another end of the first circuit, a fifth circuit having a third resistor between one end and another end and connected at the one end to another end of the fourth circuit and at the other end to a ground, a sixth circuit having a fourth resistor between one end and another end and connected at the one end to the one end of the first circuit and at the other end to the other end of the first circuit, a seventh circuit connected at one end to the other end of the first circuit, an eighth circuit having a fifth resistor between one end and another end and connected at the one end to another end of the seventh circuit and at the other end to the ground, and a controller that diagnoses a connection state of the switch and failure modes of the third, the fourth, and the seventh circuits on a basis of a voltage value at the one end of the eighth circuit and outputs a result of diagnosis.

Advantage of the Invention

According to the present invention, an operation of the switch and a failure mode of the circuit related to the switch can be diagnosed.

BRIEF DESCRIPTION OF THE DRAWINGS

FIG. 3 is a view depicting values of a voltage value inputted to a controller in each of a connection state and a failure mode of the emergency stop switch.

FIG. 4 is a flow chart illustrating a diagnosis process by the controller.

FIG. 7 is a view depicting a voltage value ADIN(1) inputted to a controller in each of a connection state and a failure mode of an emergency stop switch.

FIG. 8 is a view depicting a voltage value ADIN(2) inputted to the controller in each of the connection state and the failure mode of the emergency stop switch.

MODES FOR CARRYING OUT THE INVENTION

In the following, embodiments of the present invention are described with reference to the drawings. It is to be noted that, although the description of the embodiments is given exemplifying a dump truck as a work machine, the present invention can be also applied to other work machines.

First Embodiment

A first embodiment of the present invention is described with reference to FIGS. 1 to 5 and 10.

Figure 1:
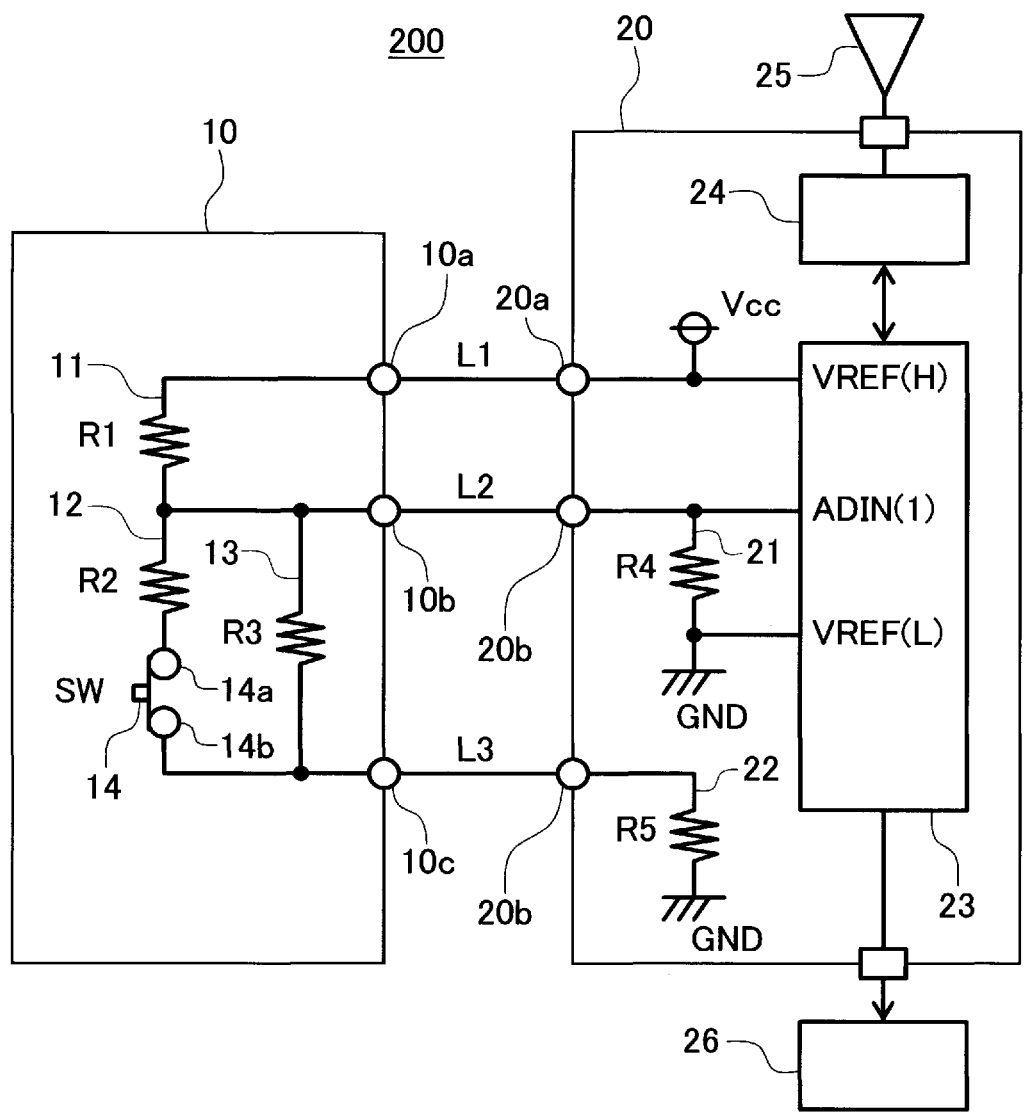
FIG. 1 is a view depicting a safety switch input diagnosis system according to a first embodiment and is a view depicting a transmission system including an emergency stop switch and a safety switch input diagnosis device.
Figure 2:
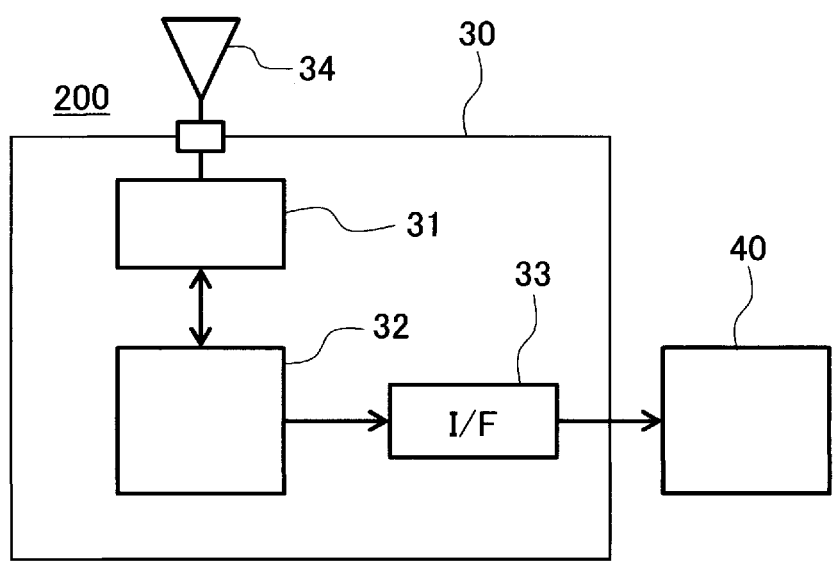
FIG. 2 is a view depicting the safety switch input diagnosis system according to the first embodiment and is a view depicting a reception system that receives an emergency stop signal transmitted from the transmission system and outputs the emergency stop signal to a machine body controller.
Figure 10:
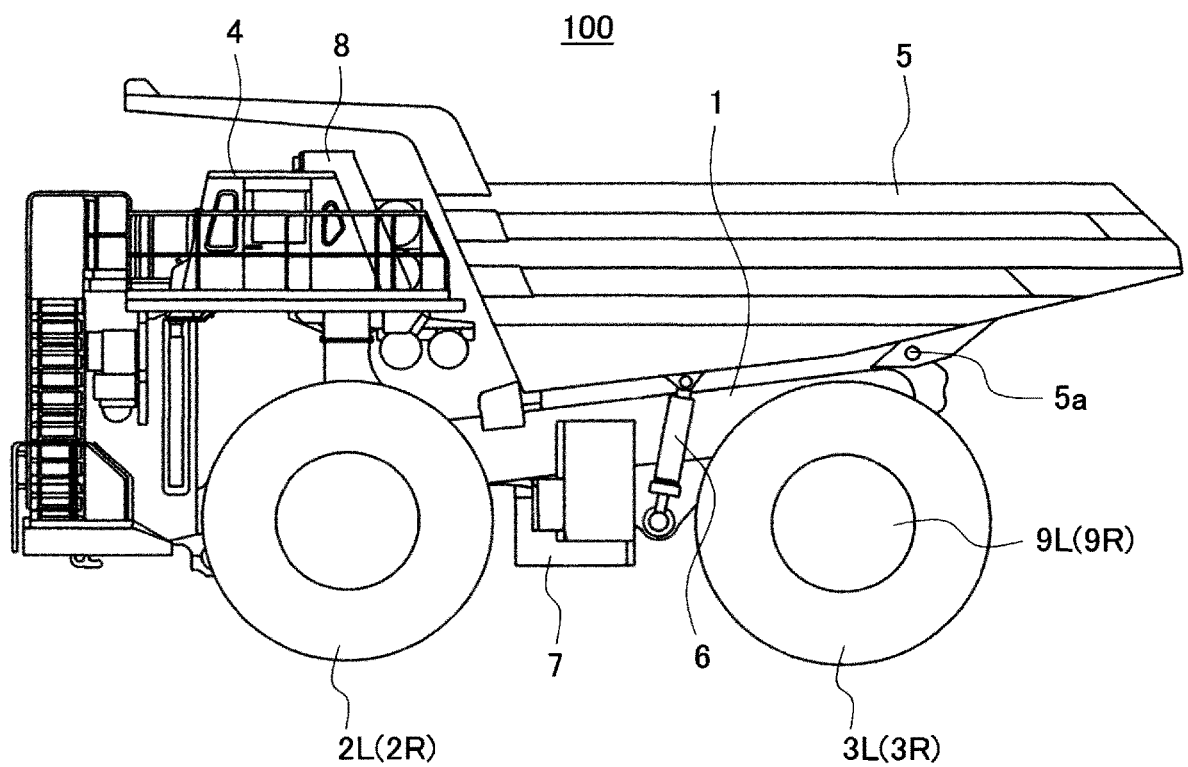
FIG. 10 is a side elevational view schematically depicting an appearance of a dump truck according to an embodiment of the present invention.

FIG. 10 is a side elevational view schematically depicting an appearance of a dump truck according to the present embodiment. In FIG. 10, in regard to a driven wheel, a driving wheel, a travelling motor, and so forth, only one of paired left and right configurations is depicted and denoted by a reference character while the other is not depicted but is denoted only by a reference character in parentheses in the figure. Meanwhile, FIGS. 1 and 2 are views depicting a safety switch input diagnosis system according to the present embodiment, and FIG. 1 depicts a transmission system including an emergency stop switch and a safety switch input diagnosis device and FIG. 2 depicts a reception system that receives the emergency stop signal transmitted from the transmission system and outputs the emergence stop signal to a machine body controller.

Referring to FIG. 10, the dump truck 100 of the electrically driven type is generally configured from a machine body frame 1 that extends in the forward and rearward direction and forms a supporting structure, a loading platform (vessel) 5 arranged so as to extend in the forward and rearward direction at an upper portion of the machine body frame 1 and provided for tilting movement on the machine body frame 1 through a pin coupling portion 5a at a rear end lower portion thereof, a pair of driven wheels (front wheels) 2L and 2R provided on the left and right of a front side under the machine body frame 1, a pair of driving wheels (rear wheels) 3L and 3R provided on the left and right of a rear side under the machine body, a cabin 4 provided on the front side over the machine body frame 1, a fuel tank 7 provided under the machine body frame 1, an engine (not depicted) arranged on the machine body frame 1 and driven by fuel supplied from the fuel tank 7, a generator (not depicted) connected to and driven by the engine, and travelling motors 9L and 9R that drive the wheels (driving wheels 3L, 3R) using electric power outputted from the generator. The travelling motors 9L and 9R are accommodated in a rotary shaft portion of the driving wheels 3L and 3R together with a speed reducer not depicted. The machine body frame 1 and the loading platform 5 are connected to each other by a hoist cylinder 6, and the loading platform 5 is pivoted around the pin coupling portion 5a by extension/contraction of the hoist cylinder 6.

A deck on which an operator can walk is attached to the machine body frame 1, and the operator can move to the cabin 4 through the deck. In the inside of the cabin 4, an accelerator pedal, a brake pedal, a hoist pedal, a steering member, and so forth are installed in the inside of the cabin 4. The operator will control the accelerating force or the braking force of the dump truck 100 in accordance with an operation amount of the accelerator pedal or the brake pedal in the cabin 4, turn the steering member to the left or the right to perform a steering operation by hydraulic driving, and operate the hoist pedal to perform dumping operation of the loading platform 5 by hydraulic driving.

Behind the cabin 4, a control cabinet 8 in which various power equipment is accommodated is carried. In the control cabinet 8, a machine body controller 40 for controlling action of the entire dump truck 100 is installed. The machine body controller 40 controls action of the dump truck 100 on the basis of an operation instruction inputted from the accelerator pedal, brake pedal, hoist pedal, steering wheel or the like. The machine body controller 40 further performs emergency stop control for stopping at least track action of the dump truck 100 on the basis of an emergency stop signal outputted by an operation of an emergency stop switch 14 of a safety switch input diagnosis system 200. It is to be noted that, though not depicted, at a portion of the machine body frame 1 positioned between the left and right driven wheels 2L and 2R, a main pump, and so forth that is a hydraulic fluid source for the hydraulic equipment are carried in addition to the engine and the generator.

Referring to FIGS. 1 and 2, the safety switch input diagnosis system 200 is configured from a transmission system (refer to FIG. 1) including the emergency stop switch and the safety switch input diagnosis device and a reception system (refer to FIG. 2) that receives and outputs an emergency stop signal transmitted from the transmission signal to the machine body controller. The safety switch input diagnosis system 200 includes a circuit 12 (first circuit) formed by a serial connection of the emergency stop switch 14 in which connection between a first contact 14a and a second contact 14b is interrupted by a pushing-in operation and a line having a resistor (first resistor) of a resistance value R2 connected to the first contact 14a or second contact 14b of the emergency stop switch 14, a circuit 11 (second circuit) having a resistor (second resistor) of a resistance value R1 between one end and the other end and connected at the one end to one end of the circuit 12, a line L1 (third circuit) connected at one end to the other end of the circuit 11 and connected at the other end to a power supply (Vcc) of a transmission unit 20, a line L3 (fourth circuit) connected at one end to the other end of the circuit 12, a circuit 22 (fifth circuit) having a resistor (third resistor) of a resistance value R5 between one end and the other end and connected at the one end to the other end of the line L3 and at the other end to the ground (GND) of the transmission unit 20, a circuit 13 (sixth circuit) having a resistor (fourth resistor) of a resistance value R3 between one end and the other end and connected at one end to the one end of the circuit 12 and at the other end to the other end of the circuit 12 such that the circuit 13 is connected in parallel to the circuit 12, a line L2 (seventh circuit) connected at one end to the other end of the circuit 12, a circuit 21 (eighth circuit) having a resistor (fifth resistor) of a resistance value R4 between one end and the other end and connected at the one end to the other end of the line L2 and at the other end to the ground (GND), and a controller 23 that diagnoses a connection state of the emergency stop switch 14 and a failure mode of the lines L1 to L3 on the basis of a voltage value (ADIN(1)) of the one end of the circuit 21 and outputs a result of the diagnosis. It is to be noted that, although FIG. 1 depicts such that the resistor of the resistance value R2 is provided on the power supply (Vcc) side of the emergency stop switch 14, it is sufficient if the resistor of the resistance value R2 is provided as the circuit 12 including the emergency stop switch 14, and accordingly, it is similar even if it is expressed that the resistor of the resistance value R2 is provided on the ground (GND) side of the emergency stop switch 14.

The transmission system of the safety switch input diagnosis system 200 is generally configured from a switch unit 10 including the emergency stop switch 14, the transmission unit 20 that transmits an emergency stop signal to the reception system, and the plurality of lines L1 to L3 that configure a signal cable for connecting the switch unit 10 and the transmission unit 20.

The switch unit 10 is configured including the emergency stop switch 14 for the instruction of emergency stop by an operation of the operator, and the circuits 11 to 13. The circuit 11 is connected at the other end to a connector 10a for the connection to the outside of the switch unit 10. Similarly, the circuit 12 is connected at the one end (one end of the circuit 13) to a connector 10b for the connection to the outside of the switch unit 10, and the circuit 12 is connected at the other end (another end of the circuit 13) to a connector 10c.

The emergency stop switch 14 is configured such that, for example, a button (power point) for being operated by the operator and a conductor (action point) that establishes conduction between the first and second contacts 14a and 14b are configured integrally as a rigid body and the contacts are released (interrupted) by an operation of the operator, and conforms to international standards formulated by so-called IEC (International Electrotechnical Commission), ISO (International Organization for Standardization), or the like.

The transmission unit 20 is configured including a power supply (Vcc) and the ground (GND), the circuits 21 and 22, the controller 23 that diagnoses a connection state of the emergency stop switch 14 and a failure mode of the lines L1 to L3 and outputs results of the diagnosis, a transmission device that transmits an emergency stop signal that is one of the results of the diagnosis of the controller 23 via an antenna 25, and a notification device 26 that notifies the operator of the information of a failure mode that is one of the results of the diagnosis of the controller 23. The power supply is connected to a connector 20a for the connection to the outside of the transmission unit 20. Similarly, the circuit 21 is connected at the one end to a connector 20b for the connection to the outside of the transmission unit 20, and the circuit 22 is connected at the one end to a connector 20c.

To the controller 23, a voltage value VREF(H) of the power supply (Vcc), a voltage value VREF(L) of the ground (GND) and a voltage value (ADIN(1)) at the one end of the circuit 21 are inputted. The controller 23 diagnoses a connection state of the emergency stop switch 14 and a failure mode of the lines L1 to L3 on the basis of the voltage values VREF(H), VREF(L), and ADIN(1). The diagnosis process of the controller 23 is hereinafter described in detail.

The notification device 26 notifies the operator of a diagnosis result of a failure mode to encourage the operator to respond and includes, for example, a monitor or a buzzer.

The connectors 10a to 10c of the switch unit 10 and the connectors 20a to 20c of the transmission unit 20 are connected by the lines L1 to L3 configuring a signal cable, respectively.

The reception system of the safety switch input diagnosis system 200 is arranged on the control cabinet 8 or the like of the dump truck 100 and is configured from a reception unit 30 including a reception device 31 that receives a result of a diagnosis (emergency stop signal) transmitted from the transmission unit 20 of the transmission system through an antenna 34 and a reception controller 32 that outputs the emergency stop signal received by the reception device 31 to the machine body controller 40 of the dump truck 100 through an interface 33.

For example, in the case where the dump truck 100 that is a work machine is operated in a mine or the like under autonomous travel control or the like, the transmission system of the safety switch input diagnosis system 200 is arranged in a monitor room or the like while the reception system is arranged on the dump truck 100. Thus, in the case where it becomes necessary to stop the dump truck 100, if the operator operates the emergency stop switch 14 to issue an emergency stop instruction, then an emergency stop signal is transmitted from the transmission unit 20 to the reception unit 30 to stop action of the dump truck 100.

FIG. 3 is a view depicting values of voltage values inputted to the controller in regarding with each of the connection state of the emergency stop switch and the failure modes.

In the transmission system of the safety switch input diagnosis system 200 of the present embodiment, a voltage value ADIN(1) to be inputted to the controller 23 is found in each of the cases of the connection state of the emergency stop switch and the failure modes as depicted in FIG. 3. At this time, the resistance values R1 to R3, R4, and R5 of the circuits 11 to 13, 21, and 22 in the present embodiment are set such that, in the cases of each of the connection state of the emergency stop switch and the failure modes, the voltage value ADIN(1) indicates values different from one another. In particular, the controller 23 can uniquely diagnose the connection state of the emergency stop switch and the failure modes on the basis of the voltage value ADIN(1).

For example, in the case where the emergency stop switch 14 is operated into an open state (interruption state) in FIG. 3, the voltage value ADIN(1) indicates a value represented by (Vcc−GND)*{R4(R3+R5)/(R3+R5+R4)}/{(R3+R5)R4/(R3+R5+R4)+R1}. On the other hand, if the line L3 is high level short-circuited by the opening, the voltage value ADIN (1) indicates a value represented by ((Vcc−GND)*R4/{R4+R1R3R2/(R3R2+R1R2+R1R3)}.

Further, the resistance values R1 to R3, R4, and R5 of the circuits 11 to 13, 21, and 22 of the present embodiment are set such that the range of fluctuation of the voltage value ADIN(1) in the case where potential difference between the ground (GND) and the power supply (Vcc) fluctuates within a range of fluctuation set in advance is separate and independent in the cases of each of the connection state of the emergency stop switch and the failure modes, namely, the ranges of fluctuation have no overlap thereamong. In particular, even in the case where the potential difference between the ground (GND) and the power supply (Vcc) fluctuates within the range of fluctuation set in advance, the controller 23 can uniquely diagnose any of the connection state of the emergency stop switch and the failure modes on the basis of the voltage value ADIN(1).

For example, in the case where the resistance values are set to resistance value R1=6000 [Ω], resistance value R2=1000 [Ω], resistance value R3=13000 [Ω], resistance value R4=100000 [Ω], resistance value R5=1000 [Ω] (in the case where the resistance values of the lines L1 to L3 are 1.05 [Ω]), even in the case where the potential difference between the ground (GND) (for example, 0 [V]) and the power supply (Vcc) (for example, 5 [V]) fluctuates within the range of 4.8 [V] to 5.2 [V], the ranges of fluctuation of the voltage value of the voltage value ADIN(1) is separate and independent among the cases of each of the connection state of the emergency stop switch and the failure modes, and the connection state of the emergency stop switch and the failure modes can be diagnosed uniquely.

Here, a diagnosis process of the controller 23 is described. The controller 23 performs a diagnosis process periodically (for example, for every minimum value of an internal processing cycle).

Figure 5:
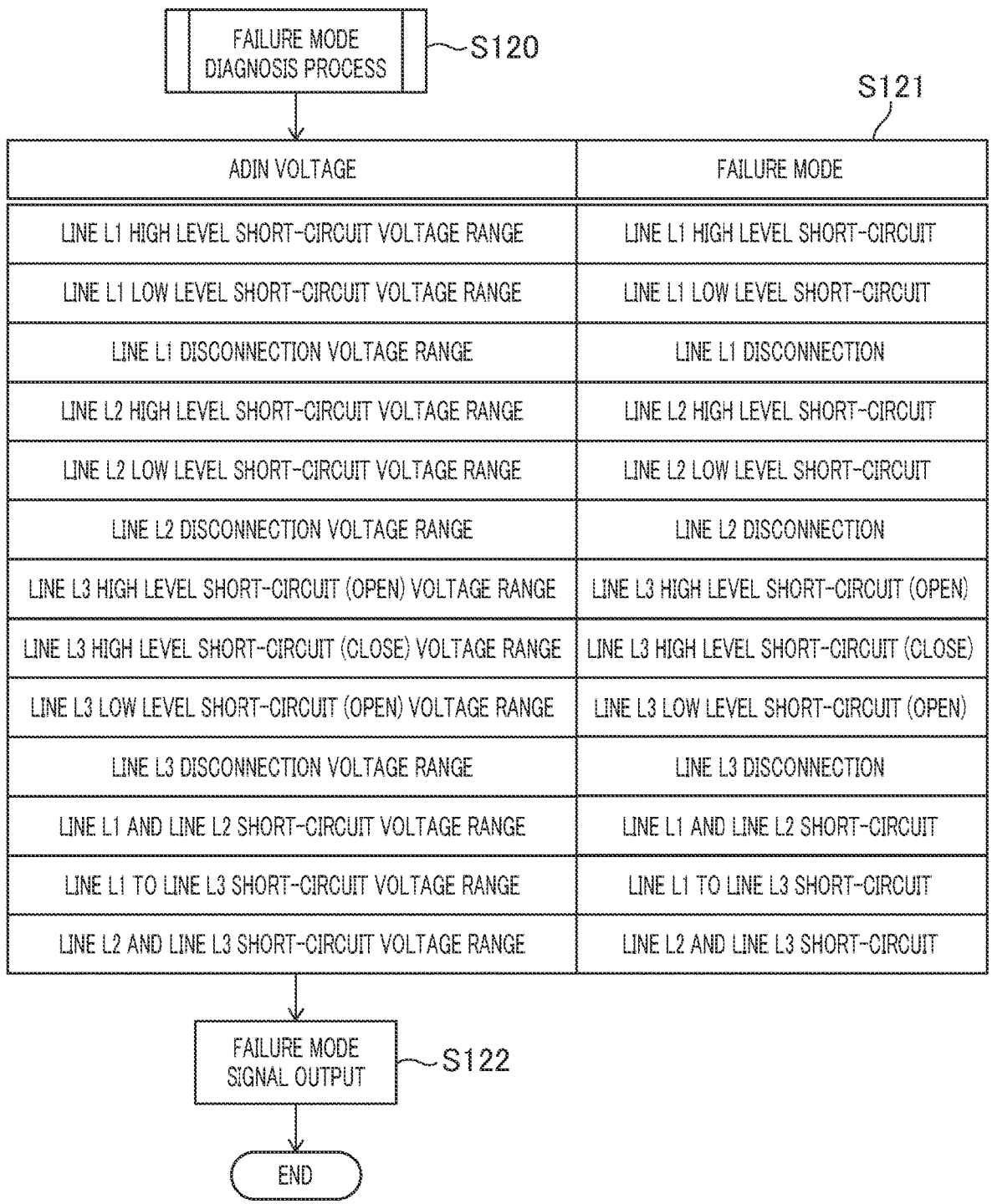
FIG. 5 is a flow chart illustrating a failure mode diagnosis process in the diagnosis process by the controller.

FIGS. 4 and 5 are flow charts illustrating a diagnosis process of the controller, and FIG. 5 is a flow chart illustrating a failure mode diagnosis process.

Referring to FIGS. 4 and 5, the controller 23 decides whether or not the voltage value ADIN(1) is within the range of the voltage value (namely, within the range of fluctuation) in a state in which the emergency stop switch 14 is in an interruption state as a result of an operation (step S100). In the case where a result of the decision is YES, the controller 23 outputs an emergency stop signal to the dump truck 100 through a transmission device 24 (step S101) and then ends the processing. On the other hand, in the case where the result of the decision in step S100 is NO, the controller 23 decides whether or not the voltage value ADIN(1) is within a range of the voltage value (namely, within the range of fluctuation) in a state in which the emergency stop switch 14 is not operated (step S110), and ends the processing in the case where the result of the decision is YES.

On the other hand, in the case where the decision result in step S110 is YES, the controller 23 performs a failure mode diagnosis process (step S120). The controller 23 has therein a diagnosis map of failure modes in which, in the case where the potential difference between the ground (GND) and the power supply (Vcc) fluctuates within the range of fluctuation set in advance, ranges of fluctuation of the voltage value ADIN(1) in the cases of each of the connection state of the emergency stop switch and the failure modes are set in advance. In the failure mode diagnosis process, the controller 23 diagnoses a failure mode on the basis of the voltage value ADIN(1) and the diagnosis map (step S121), outputs a result of the diagnosis to the notification device 26 (step S122), and ends the processing.

Advantages of the present embodiment configured in such a manner as described above are described.

In the prior art in which a failure of a circuit including an operation switch is diagnosed by monitoring whether or not a potential state that occurs by inputting a test pulse to the circuit is correct, an open state by an operation of the operation switch and a disconnection state of a line cannot be distinguished, and the support relating to functional safety is not sufficient.

In contrast, in the present embodiment, the safety switch input diagnosis device includes a circuit 12 formed from a series connection of an emergency stop switch 14 capable of interrupting connection between a first contact 14a and a second contact 14b and a resistor having a resistance value R2 and connected to the first contact 14a or second contact 14b of the emergency stop switch 14, a circuit 11 having a resister of a resistance value R1 between one end and the other end and connected at the one end to one end of the circuit 12, a line L1 connected at one end to the other end of the circuit 11 and at the other end to a power supply (Vcc), a line L3 connected at one end to the other end of the circuit 12, a circuit 22 having a resistor of a resistance value R5 between one end and the other end and connected at the one end to the other end of the line L3 and at the other end to a ground (GND), a circuit 13 having a resistor of a resistance value R3 between one end and the other end and connected at the one end to the one end of the circuit 12 and at the other end to the other end of the circuit 12, a line L2 connected at one end to the other end of the circuit 12, a circuit 21 having a resistor of a resistance value R4 between one end and the other end and connected at the one end to the other end of the line L2 and at the other end to the ground, and a controller 23 that diagnoses a connection state of the switch and failure modes of the third, the fourth, and the seventh circuits on the basis of a voltage value (ADIN(1)) at the one end of the circuit 21 and outputs a result of the diagnosis.

Consequently, the resistance values R1 to R3, R4, and R5 of the circuits 11 to 13, 21, and 22 can be set such that the voltage value ADIN(1) indicates values all different from one another in cases of each of the connection state of the emergency stop switch and the failure modes, and the connection state of the emergency stop switch and the failure modes can be diagnosed uniquely on the basis of the voltage value ADIN(1). In other words, an operation of the switch and the failure modes of the circuit relating to the switch can be diagnosed.

Second Embodiment

A second embodiment is described with reference to FIGS. 6 to 9. In the description of the present embodiment, only differences from the first embodiment are described, and like members to those of the first embodiment in the drawings are denoted by like reference characters and description of them is omitted.

In the present embodiment, a voltage value ADIN(2) is referred to in addition to the voltage value ADIN(1) in the first embodiment to make it possible to diagnose the connection state of the emergency stop switch and the failure modes with a higher degree of accuracy.

Figure 6:
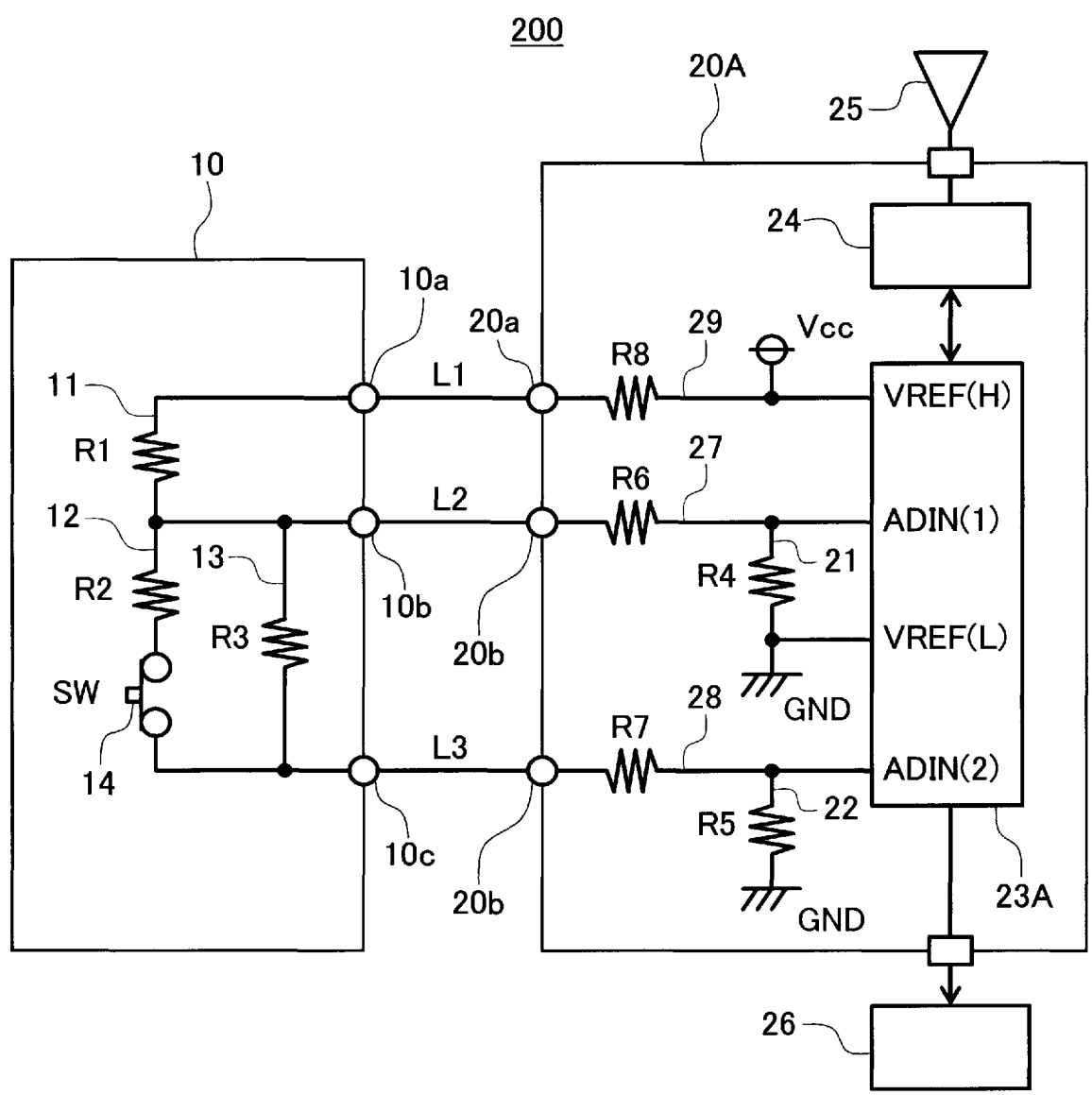
FIG. 6 is a view depicting a transmission system of a safety switch input diagnosis system according to a second embodiment.

FIG. 6 is a view depicting a transmission system of a safety switch input diagnosis system according to the present embodiment.

Referring to FIG. 6, the transmission system of the safety switch input diagnosis system 200 includes, in addition to the configuration according to the first embodiment, a circuit 27 (ninth circuit) having a resistor (sixth resistor) of a resistance value R6 inserted between the other end of the line L2 (seventh circuit) and the one end of the circuit 21 (eighth circuit), a circuit 28 (tenth circuit) having a resistor (seventh resistor) of a resistance value R7 inserted between the other end of the line L3 (fourth circuit) and the one end of the circuit 22 (fifth circuit), and a circuit 29 (eleventh circuit) having a resistor (eighth resistor) of a resistance value R8 inserted between the other end of the line L1 (third circuit) and the power supply (Vcc).

A controller 23A diagnoses a connection state of the emergency stop switch 14 and failure modes of the lines L1 to L3 on the basis of the voltage value ADIN(1) at the one end of the circuit 21 and the voltage value ADIN(2) at the one end of the circuit 22, and outputs a result of the diagnosis.

The transmission system of the safety switch input diagnosis system 200 is generally configured from a switch unit 10 having an emergency stop switch 14, a transmission unit 20A that transmits an emergency stop signal to the reception system, and a plurality of lines L1 to L3 configuring a signal cable that connects the switch unit 10 and the transmission unit 20A to each other.

The transmission unit 20A is configured including a power supply (Vcc) and the ground (GND), circuits 21 and 22, a controller 23A that diagnoses a connection state of the emergency stop switch 14 and failure modes of the lines L1 to L3 and outputs a result of the analysis, a transmission device 24 that transmits an emergency stop signal that is one of results of diagnosis of the controller 23A through an antenna 25, and a notification device 26 for notifying an operator of information of a failure mode that is one of results of diagnosis of the controller 23A. The power supply is connected to a connector 20a for the connection to the outside of the transmission unit 20A. Similarly, the circuit 21 is connected at one end to a connector 20b for the connection to the outside of the transmission unit 20A, and the circuit 22 is connected at one end to a connector 20c.

To the controller 23A, a voltage value VREF(H) of the power supply (Vcc), a voltage value VREF(L) of the ground (GND), a voltage value (ADIN(1)) at the one end of the circuit 21 and a voltage value ADIN(2) at the one end of the circuit 22 are inputted. The controller 23 diagnoses a connection state of the emergency stop switch 14 and failure modes of the lines L1 to L3 on the basis of the voltage values VREF(H), VREF(L), ADIN(1), and ADIN(2).

FIGS. 7 and 8 are views depicting values of voltage values inputted to the controller in regard to each of the connection state of the emergency stop switch and the failure modes, and FIG. 7 depicts the voltage value ADIN(1) and FIG. 8 depicts the voltage value ADIN(2).

In the transmission system of the safety switch input diagnosis system 200 of the present embodiment, the voltage value ADIN(1) and the voltage value ADIN(2) inputted to the controller 23A are found in the cases of each of the connection state of the emergency stop switch and the failure modes as depicted in FIGS. 7 and 8. At this time, the resistance values R1 to R3, R4, and R5 of the circuits 11 to 13, 21, and 22 in the present embodiment are set such that, in the cases of each of the connection state of the emergency stop switch and the failure modes, the voltage value ADIN(1) and the voltage value ADIN(2) indicate values different from one another. In other words, the controller 23A can uniquely diagnose the connection state of the emergency stop switch and the failure modes on the basis of the voltage value ADIN(1) and the voltage value ADIN(2).

Further, in the case where the potential difference between the ground (GND) and the power supply (Vcc) fluctuates within a range of fluctuation set in advance, even in the case where the ranges of fluctuation of the voltage value ADIN(1) are near to each other in the cases of each of the connection state of the emergency stop switch and the failure modes, since the diagnosis is performed on the basis of the two conditions for the voltage value ADIN(1) and the voltage value ADIN(2), the connection state of the emergency stop switch and the failure modes can be diagnosed with a higher degree of accuracy.

Here, a diagnosis process by the controller 23A is described. It is to be noted here that the failure mode diagnosis process (step S220) (correspond to the process in step S120 of the first embodiment) in the diagnosis process is only described.

Figure 9:
FIG. 9 is a flow chart illustrating a failure mode diagnosis process in a diagnosis process according to the second embodiment.

FIG. 9 is a flow chart illustrating the failure mode diagnosis process in the diagnosis process in the controller.

In the case where the result of the decision in step S110 of FIG. 4 (first embodiment) is YES, the failure mode diagnosis process is performed (step S220). The controller 23A has therein a diagnosis map of failure modes in which, in the case where the potential difference between the ground (GND) and the power supply (Vcc) fluctuates within the range of fluctuation set in advance, ranges of fluctuation of the voltage value ADIN(1) and the voltage value ADIN(2) in the cases of each the connection state of the emergency stop switch and the failure modes are set in advance. In the failure mode diagnosis process, the controller 23A diagnoses a failure mode on the basis of the voltage value ADIN(1), voltage value ADIN(2) and diagnosis map (step S221), outputs a result of the diagnosis to the notification device 26 (step S222), and ends the processing.

The configuration of the other part is similar to that of the first embodiment.

Also, in the present embodiment configured in such a manner as described above, advantages similar to those of the first embodiment can be achieved.

Further, since the safety switch input diagnosis device is configured such that the voltage value ADIN(2) is referred to in addition to the voltage value ADIN(1) in the first embodiment, the connection state of the emergency stop switch and the failure modes can be diagnosed with a higher degree of accuracy.

Features of the embodiments described above are described below.

(1) In the embodiments described above, the safety switch input diagnosis device includes a first circuit (for example, the circuit 12) formed from a series connection of a switch (for example, the emergency stop switch 14) capable of interrupting connection between a first contact 14a and a second contact 14b and a line having a first resistor (for example, the resistor having the resistance value R2) connected to the first or the second contact of the switch, a second circuit (for example, the circuit 11) having a second resister (for example, the resistor of the resistance value R1) between one end and the other end and connected at the one end to one end of the first circuit, a third circuit (for example, the line L1) connected at one end to another end of the second circuit and at the other end to a power supply, a fourth circuit (for example, the line L3) connected at one end to the other end of the first circuit, a fifth circuit (for example, the circuit 22) having a third resistor (for example, the resistor of the resistance value R5) between one end and the other end and connected at the one end to the other end of the fourth circuit and at the other end to a ground (GND), a sixth circuit (for example, the circuit 13) having a fourth resistor (for example, the resistor of the resistance value R3) between one end and the other end and connected at the one end to the one end of the first circuit and at the other end to the other end of the first circuit, a seventh circuit (for example, the line L2) connected at one end to the other end of the first circuit, an eighth circuit (for example, the circuit 21) having a fifth resistor (for example, the resistor of the resistance value R4) between one end and the other end and connected at the one end to another end of the seventh circuit and at the other end to the ground, and a controller 23 that diagnoses a connection state of the switch and failure modes of the third, the fourth, and the seventh circuits on the basis of a voltage value (for example, ADIN(1)) at the one end of the eighth circuit and outputs a result of the diagnosis.

Consequently, an operation of the switch and the failure modes of circuits relating to the switch can be diagnosed.

(2) Further, in the embodiments described hereinabove, in the safety switch input diagnosis device of (1), the resistance values of the first to the fifth resistors (for example, the resistance values R1 to R5) are set such that the voltage value (for example, ADIN(1)) at the one end of the eighth circuit (for example, the circuit 21) inputted to the controller 23 indicates each of different values from each other in accordance with each of states of interruption of connection of the switch (for example, the emergency stop switch 14), and high level short-circuiting, low level short-circuiting, interruption, and inter-line short-circuiting individually of the third, the fourth, and the seventh circuits (for example, the lines L1 to L3).

(3) Further, in the embodiments described hereinabove, in the safety switch input diagnosis device of (1), the resistance values of the first to the fifth resistors (for example, the resistance values R1 to R5) are set such that, where the potential difference between the ground (GND) and the power supply (Vcc) fluctuates within a range of fluctuation set in advance, the range of fluctuation occurring with the voltage value (for example, ADIN(1)) at the one end of the eighth circuit (for example, the circuit 21) inputted to the controller 23 is independent in, and in accordance with, each of states of interruption of connection of the switch (for example, the emergency stop switch 14), and high level short-circuiting, low level short-circuiting, interruption, and inter-line short-circuiting individually of the third, the fourth, and the seventh circuits (for example, the lines L1 to L3).

(4) Further, in the embodiments described hereinabove, the safety switch input diagnosis device of (1) further includes a ninth circuit (for example, the circuit 27) having a sixth resistor (for example, the resistor of the resistance value R6) inserted between the other end of the seventh circuit (for example, the line L2) and the one end of the eighth circuit (for example, the circuit 21), a tenth circuit (for example, the circuit 28) having a seventh resistor (for example, the resistor of the resistance value R7) inserted between the other end of the fourth circuit (for example, the line L3) and the one end of the fifth circuit (for example, the circuit 22), and an eleventh circuit (for example, the circuit 29) having an eighth resistor (for example, the resistor of the resistance value R8) inserted between the other end of the third circuit (for example, the line L1) and the power supply (Vcc), and the controller 23 diagnoses the connection state of the switch (for example, the emergency stop switch 14) and the failure modes of the third, the fourth, and the seventh circuits (for example, the lines L1 to L3) on the basis of a voltage value (for example, ADIN(1)) at the one end of the eighth circuit and a voltage value (for example, ADIN(2)) at the one end of the fifth circuit and outputs a result of the diagnosis.

Consequently, the connection state of the emergency stop switch and the failure modes can be diagnosed with a high degree of accuracy.

(5) In the embodiments described hereinabove, a work machine (for example, the dump truck 100) includes travelling motors 9L and 9R driven by electric power generated by a generator driven by an engine, driving wheels 3L and 3R driven by the travelling motors, and a machine body controller 40 that controls action of the engine, the generator, the travelling motor, and a brake system that brakes the driving wheels, and a safety switch input diagnosis system 200 that in turn includes the safety switch input diagnosis device according to claim 1, a transmission device 24 that transmits a result of diagnosis of the safety switch input diagnosis device, a reception device 31 that receives the result of the diagnosis transmitted from the transmission device, and a reception controller 32 that outputs the result of the diagnosis received by the reception device to the machine body controller, and the machine body controller controls action of the engine, the generator, the travelling motor, and the brake system on the basis of the result of the diagnosis outputted from the reception controller.

APPENDIX

It is to be noted that the present invention is not restricted to the embodiments described above and includes various modifications and combinations without departing from the subject matter thereof. Further, the present invention is not limited to devices that include all configurations described in the description of the embodiments and includes devices in which part of the configurations is removed. Further, each of the configurations, functions, and so forth described above may be partly or entire implemented, for example, by designing the same with an integrated circuit or the like. Alternatively, the configurations, functions, and so forth described above may be implemented by software by causing a processor to interpret and execute a program for implementing each of the functions.

Further, although the present embodiments exemplify a case in which the switch unit 10 and the transmission units 20 and 20A are configured as separate members and connected to each other by the lines L1 to L3, this is not restrictive, and the switch unit 10 and the transmission units 20 and 20A may be configured integrally. In this case, for example, the lines L1 to L3 are formed on a circuit board, and the controllers 23 and 23A diagnoses the connection state of the emergency stop switch 14 and the failure modes of the lines L1 to L3.

DESCRIPTION OF REFERENCE CHARACTERS

1: Machine body frame
2L, 2R: Driven wheel (front wheel)
3L, 3R: Driving wheel (rear wheel)
4: Cabin
5: Loading platform (vessel)
5a: Pin coupling portion
6: Hoist cylinder
7: Fuel tank
8: Control cabinet
9L, 9R: Travelling motor
10: Switch unit
10a, 10b, 10c: Connector
11, 12, 13: Circuit
14: Emergency stop switch
14a: First contact
14b: Second contact
20, 20A: Transmission unit
20a, 20b, 20c: Connector
21, 22: Circuit
23, 23A Controller
24: Transmission device
25: Antenna
26: Notification device
27, 28, 29: Circuit
30: Reception unit
31: Reception device
32: Reception controller
33: Interface
34: Antenna
40: Machine body controller
100: Dump truck
200: Safety switch input diagnosis system
L1 to L3: Line

The invention claimed is:
1. A safety switch input diagnosis device, comprising:
a first circuit formed from a series connection of a switch capable of interrupting connection between a first contact and a second contact and a line having a first resistor connected to the first or the second contact of the switch;
a second circuit having a second resistor between one end and another end and connected at the one end to one end of the first circuit;
a third circuit connected at one end to the other end of the second circuit and at another end to a power supply;

a fourth circuit connected at one end to another end of the first circuit;
a fifth circuit having a third resistor between one end and another end and connected at the one end to another end of the fourth circuit and at the other end to a ground;
a sixth circuit having a fourth resistor between one end and another end and connected at the one end to the one end of the first circuit and at the other end to the other end of the first circuit;
a seventh circuit connected at one end to the other end of the first circuit;
an eighth circuit having a fifth resistor between one end and another end and connected at the one end to another end of the seventh circuit and at the other end to the ground; and
a controller that diagnoses a connection state of the switch and failure modes of the third, the fourth, and the seventh circuits on a basis of a voltage value at the one end of the eighth circuit and outputs a result of diagnosis.

2. The safety switch input diagnosis device according to claim 1, wherein
resistance values of the first to the fifth resistors are set such that the voltage value at the one end of the eighth circuit inputted to the controller indicates each of different values from each other in accordance with each of states of interruption of connection of the switch, and high level short-circuiting, low level short-circuiting, interruption, and inter-circuit short-circuiting individually of the third, the fourth, and the seventh circuits.

3. The safety switch input diagnosis device according to claim 1, wherein
resistance values of the first to the fifth resistors are set such that, in a case where potential difference between the ground and the power supply fluctuates within a range of fluctuation set in advance, the range of fluctuation occurring with the voltage value at the one end of the eighth circuit inputted to the controller is independent in, and in accordance with, each of states of interruption of connection of the switch, and high level short-circuiting, low level short-circuiting, interruption, and inter-circuit short-circuiting individually of the third, the fourth, and the seventh circuits.

4. The safety switch input diagnosis device according to claim 2, further comprising:
a ninth circuit having a sixth resistor inserted between the other end of the seventh circuit and the one end of the eighth circuit;
a tenth circuit having a seventh resistor inserted between the other end of the fourth circuit and the one end of the fifth circuit; and
an eleventh circuit having an eighth resistor inserted between the other end of the third circuit and the power supply, wherein
the controller diagnoses the connection state of the switch and the failure modes of the third, the fourth, and the seventh circuits on a basis of a voltage value at the one end of the eighth circuit and a voltage value at the one end of the fifth circuit and outputs a result of the diagnosis.

5. A work machine, comprising:
a travelling motor driven by electric power generated by a generator driven by an engine;
a driving wheel driven by the travelling motor;
a machine body controller that controls action of the engine, the generator, the travelling motor, and a brake system that brakes the driving wheel; and
a safety switch input diagnosis system that includes the safety switch input diagnosis device according to claim 1, a transmission device that transmits a result of diagnosis of the safety switch input diagnosis device, a reception device that receives the result of the diagnosis transmitted from the transmission device, and a reception controller that outputs the result of the diagnosis received by the reception device to the machine body controller, wherein
the machine body controller controls action of the engine, the generator, the travelling motor, and the brake system on a basis of the result of the diagnosis outputted from the reception controller.

* * * * *